United States Patent
Zang et al.

(10) Patent No.: US 10,734,233 B2
(45) Date of Patent: Aug. 4, 2020

(54) FINFET WITH HIGH-K SPACER AND SELF-ALIGNED CONTACT CAPPING LAYER

(71) Applicant: GLOBALFOUNDRIES INC., Grand Cayman (KY)

(72) Inventors: Hui Zang, Guilderland, NY (US); Guowei Xu, Ballston Lake, NY (US); Keith Tabakman, Wilton, NY (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 0 days.

(21) Appl. No.: 15/902,098

(22) Filed: Feb. 22, 2018

(65) Prior Publication Data
US 2019/0259619 A1    Aug. 22, 2019

(51) Int. Cl.
| | |
|---|---|
| *H01L 21/28* | (2006.01) |
| *H01L 29/78* | (2006.01) |
| *H01L 29/49* | (2006.01) |
| *H01L 23/535* | (2006.01) |
| *H01L 21/768* | (2006.01) |

(Continued)

(52) U.S. Cl.
CPC .. *H01L 21/28123* (2013.01); *H01L 21/76805* (2013.01); *H01L 21/76846* (2013.01); *H01L 21/76895* (2013.01); *H01L 23/535* (2013.01); *H01L 29/41791* (2013.01); *H01L 29/4983* (2013.01); *H01L 29/66545* (2013.01); *H01L 29/66795* (2013.01); *H01L 29/785* (2013.01); *H01L 29/7851* (2013.01)

(58) Field of Classification Search
CPC ......... H01L 21/28123; H01L 29/66795; H01L 21/76846; H01L 21/76805; H01L 29/66545; H01L 23/535; H01L 29/4983; H01L 29/7851; H01L 21/76895
See application file for complete search history.

(56) References Cited

U.S. PATENT DOCUMENTS

| | | | |
|---|---|---|---|
| 7,598,142 B2 | 10/2009 | Ranade et al. | |
| 8,679,968 B2 | 3/2014 | Xie et al. | |

(Continued)

FOREIGN PATENT DOCUMENTS

| | | |
|---|---|---|
| TW | 201236086 A | 9/2012 |
| TW | 201239991 A | 10/2012 |
| TW | 201332021 A | 8/2013 |

OTHER PUBLICATIONS

TW Examination Report and English Translation thereof for corresponding Taiwanese Patent Application No. 107113040 dated Oct. 30, 2019, 8 pages.

*Primary Examiner* — Marcos D. Pizarro
(74) *Attorney, Agent, or Firm* — Francois Pagette; Hoffman Warnick LLC (57) ABSTRACT

In the manufacture of a FinFET device, an isolation architecture is provided between gate and source/drain contact locations. The isolation architecture may include a low-k spacer layer and a contact etch stop layer. The isolation architecture further includes a high-k, etch-selective layer that is adapted to resist degradation during an etch to open the source/drain contact locations. The high-k layer, in conjunction with a self-aligned contact (SAC) capping layer disposed over the gate, forms an improved isolation structure that inhibits short circuits or parasitic capacitance between the gate and source/drain contacts.

14 Claims, 7 Drawing Sheets

(51) Int. Cl.
*H01L 29/66* (2006.01)
*H01L 29/417* (2006.01)

(56) References Cited

U.S. PATENT DOCUMENTS

| | | | |
|---|---|---|---|
| 9,112,031 B2 | 8/2015 | Leobandung | |
| 9,129,986 B2 | 9/2015 | Zang et al. | |
| 9,536,980 B1* | 1/2017 | Huang | H01L 29/78 |
| 2009/0224312 A1* | 9/2009 | Taketani | H01L 27/10876 |
| | | | 257/330 |
| 2012/0139062 A1* | 6/2012 | Yuan | H01L 21/76897 |
| | | | 257/411 |
| 2015/0187946 A1* | 7/2015 | Park | H01L 29/66795 |
| | | | 257/368 |
| 2015/0249036 A1* | 9/2015 | Cai | H01L 23/485 |
| | | | 257/382 |
| 2017/0170168 A1* | 6/2017 | Basker | H01L 27/0733 |
| 2017/0317079 A1* | 11/2017 | Kim | H01L 21/30604 |

\* cited by examiner

FINFET WITH HIGH-K SPACER AND SELF-ALIGNED CONTACT CAPPING LAYER

BACKGROUND

The present application relates generally to methods for forming semiconductor devices, and more specifically to methods for forming fin field effect transistors (FinFETs) having a reduced risk of electrical shorts between gate and source/drain contacts.

A trend in the development of semiconductor manufacturing technologies has been to increase the density of devices per chip, and hence decrease the size of active structures as well as the distances between such structures. An increase in device density may advantageously affect device performance such as circuit speed, and may allow also for increasingly complex designs and functionality. However, the decrease in size and the attendant increase in density may also generate undesirable effects, including unwanted short circuits between adjacent conductive elements.

In advanced node FinFET devices, for instance, the proximity of gate contacts and source/drain contacts may lead to unwanted parasitic capacitance or conduction, i.e., leakage, between these adjacent structures, particularly at the respective top and bottom portions of the structures, which can adversely affect yield.

SUMMARY

It is therefore desirable to develop semiconductor device architectures and methods for fabricating semiconductor device architectures that have a decreased propensity for unwanted short circuits between adjacent conductive elements, such as between adjacent gate and source/drain contacts.

Figure 1:
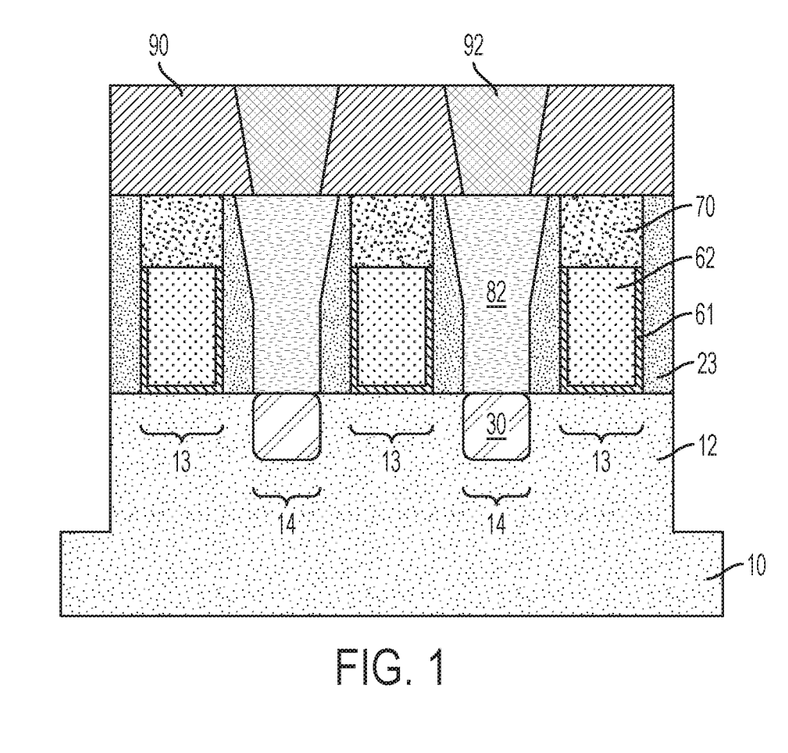
FIG. 1 is a schematic diagram of a comparative FinFET architecture.

Referring to FIG. 1, a comparative FinFET architecture at an intermediate stage of fabrication includes a semiconductor fin 12 disposed over a semiconductor substrate 10. Fin 12 includes alternating channel 13 and source/drain regions 14. A gate dielectric layer 61, metal gate 62 and capping layer 70 are formed in succession over each channel region 13, and a source/drain junction 30 is formed over each source/drain region 14. A conductive contact 82 is disposed over each source/drain junction 30, and an interlayer dielectric 90 is formed over the structure. Openings in the interlayer dielectric 90 are metallized with source/drain contacts 92. Laterally separating the metal gates 62 and the overlying capping layers 70 from the conductive contacts 82 is a low-k spacer layer 23.

As will be appreciated, during manufacture of the structure of FIG. 1, formation of the conductive contacts 82 includes one or more etching steps that selectively remove a dielectric layer (not shown) from over the source/drain junctions 30 following by metallization of the resulting trench. An insufficient etch (under-etch) may result in the incomplete removal of the dielectric layer material from over the source/drain junctions 30, which may result in an electrical open. An over-etch of the dielectric layer, on the other hand, may cause erosion of the low-k spacer layer 23, particularly at the top of the structure, which may result in bridging and an electrical short between the metal gate 62 and the conductive contact 82. In the comparative architecture of FIG. 1, an upper portion of spacer layer 23 is laterally etched during opening of the trench for the conductive contact 82.

In accordance with various embodiments, the formation of a FinFET device includes the removal of a top portion of the spacer layer and the subsequent formation of a high-k layer over the fin and over remaining portions of the spacer layer within the trench for the source/drain conductive contacts. In various embodiments, the high-k layer, in combination with the capping layer overlying the gate contact, forms an effective barrier between the gate and source/drain contacts. Furthermore, according to various embodiments, removal of a top portion of the spacer layer widens an upper portion of a gate contact opening over channel regions of the fin, which improves the manufacturability of the gate contact within the gate contact opening.

According to certain embodiments, a FinFET device includes a semiconductor fin having a source/drain region and a channel region adjacent to the source/drain region, a conductive contact disposed over the source/drain region, a gate stack disposed over the channel region, where the gate stack comprises a high-k layer and a gate conductor layer overlying the high-k layer, and a capping layer disposed over the gate stack, where the high-k layer extends over a sidewall surface of the capping layer between the capping layer and the conductive contact.

According to further embodiments, a FinFET device includes a semiconductor fin having a source/drain region and a channel region adjacent to the source/drain region, a conductive contact disposed over the source/drain region, a gate stack disposed over the channel region, a capping layer disposed over the gate stack, a low-k spacer layer between the conductive contact and the gate stack, and a high-k layer disposed over the isolation layer, where the high-k layer extends over a sidewall surface of the capping layer between the capping layer and the conductive contact.

A method of forming a FinFET device includes forming a semiconductor fin over a semiconductor substrate, the semiconductor fin having a source/drain region and a channel region adjacent to the source/drain region, forming a sacrificial gate over the channel region, and forming a low-k spacer layer over sidewalls of the sacrificial gate.

The method further includes forming a contact etch stop layer over the source/drain region, and a dielectric fill layer over the contact etch stop layer, wherein the contact etch stop layer is formed over sidewalls of the low-k spacer layer, etching an upper portion of the sacrificial gate and an upper portion of the low-k spacer layer to form an upper gate contact opening, and etching the sacrificial gate to form a lower gate contact opening and expose the channel region of the fin.

A high-k layer is formed within the lower and upper gate contact openings, wherein the high-k layer is formed over the channel region of the fin, over sidewalls of the low-k spacer layer and over sidewalls of the contact etch stop layer.

A gate conductor layer is then formed within the lower gate contact opening, and a capping layer is formed over the gate conductor layer within the upper gate contact opening.

BRIEF DESCRIPTION OF SEVERAL VIEWS OF THE DRAWINGS

The following detailed description of specific embodiments of the present application can be best understood when read in conjunction with the following drawings, where like structure is indicated with like reference numerals and in which.

DETAILED DESCRIPTION

Reference will now be made in greater detail to various embodiments of the subject matter of the present application, some embodiments of which are illustrated in the accompanying drawings. The same reference numerals will be used throughout the drawings to refer to the same or similar parts.

As used herein, the formation or deposition of a layer or structure may involve one or more techniques suitable for the material or layer being deposited or the structure being formed. Such techniques include, but are not limited to, chemical vapor deposition (CVD), low-pressure chemical vapor deposition (LPCVD), plasma enhanced chemical vapor deposition (PECVD), metal organic CVD (MOCVD), atomic layer deposition (ALD), molecular beam epitaxy (MBE), electroplating, electroless plating, ion beam deposition, and physical vapor deposition (PVD) techniques such as sputtering or evaporation.

Disclosed is a method of manufacturing a FinFET device as well as the resulting device where a high-k layer is incorporated into a barrier layer architecture between gate and source/drain contacts. In certain embodiments, a portion of the high-k layer is formed over a channel region of a fin within a gate contact opening to provide a gate dielectric layer. The high-k layer also extends over sidewalls of the gate contact opening and overlies sidewalls of the spacer layer to form a portion of an isolation architecture.

During the processing steps used to open and metallize trenches to provide conductive contacts to source/drain regions of the device, the high-k layer is adapted to serve as an etch-resistant barrier that inhibits erosion of the underlying dielectric layers and thus prevents shorting between the metal gate and the source/drain metallization. In particular, the high-k layer is resistant to the etch chemistries used to open the source/drain contact locations, and thus provides a chemically- and mechanically-robust interface relative to the incumbent isolation architecture that includes a low-k spacer and contact etch stop layer.

In various embodiments, a self-aligned contact (SAC) capping layer is formed over a recessed metal gate, such that a bottom surface of the SAC cap is disposed below a bottom surface of the low-k spacer. The high-k layer is disposed over sidewall and top surfaces of the low-k spacer and over sidewalls of the SAC cap, i.e., between the low-k spacer and the SAC cap.

The incorporation of a high-k layer into methods for forming a FinFET device, and the formation of an overlying self-aligned contact (SAC) capping layer are described herein with reference to FIGS. 2-12.

Figure 2:
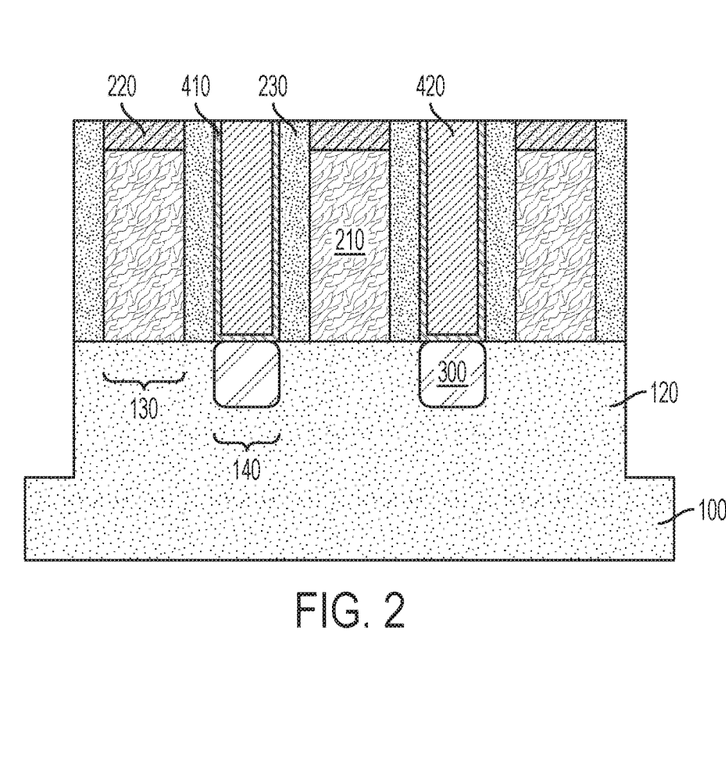
FIG. 2 is a planarized FinFET structure at an intermediate stage of fabrication following the formation of sacrificial gates over channel regions of a semiconductor fin, a spacer layer over sidewalls of the sacrificial gates, source/drain junctions over source/drain regions of the fin, and a contact etch stop layer and dielectric fill layer between adjacent spacer layers and over the source/drain junctions.

Referring to FIG. 2, a semiconductor fin 120 is formed over a semiconductor substrate 100. The semiconductor substrate may be a bulk substrate or a composite substrate such as a semiconductor-on-insulator (SOI) substrate, and may include any suitable semiconductor material as known to those skilled in the art. Portions of the semiconductor substrate may be amorphous, polycrystalline, or single crystalline. Although a single fin is shown in the illustrated cross-section, it will be appreciated that an array of fins may be formed over the substrate.

In various embodiments, each fin 120 includes a semiconductor material such as silicon, and may be formed by patterning and then etching the semiconductor substrate 100, e.g., a top portion of the semiconductor substrate. In several embodiments, the fins 120 are etched from, and therefore contiguous with the semiconductor substrate 100. For instance, fins 120 may be formed using a sidewall image transfer (SIT) process as known to those skilled in the art.

Each fin 120 can include a single crystal semiconductor material that extends along a lengthwise direction. As used herein, a "lengthwise direction" is a horizontal direction along with an object extends the most. A "widthwise direction" is a horizontal direction that is perpendicular to the lengthwise direction.

As used here, "horizontal" refers to a general direction along a primary surface of a substrate, and "vertical" is a direction generally orthogonal thereto. Furthermore, "vertical" and "horizontal" are generally perpendicular directions relative to one another independent of orientation of the substrate in three-dimensional space.

In certain embodiments, the fins 120 can have a width of 5 nm to 20 nm, and a height of 40 nm to 150 nm, although other dimensions are contemplated. In structures including plural fins, i.e., a fin array, each fin may be spaced apart from its nearest neighbor by a periodicity or pitch (d) of 20 nm to 100 nm, e.g., 20, 30, 40, 50, 60, 70, 80, 90 or 100 nm, including ranges between any of the foregoing values. As used herein, the term "pitch" refers to the sum of the fin width and the spacing between neighboring fins.

Such plural fins are typically oriented parallel to each other and perpendicular to the library logic flow of a circuit. After fin formation, a fin cut or fin removal process may be used to eliminate unwanted fins or unwanted portions thereof for the particular circuit or device being fabricated. Thus, the fin-to-fin periodicity may be constant or variable over an array of fins.

Referring still to FIG. 2, shown is a cross-sectional, post-planarization view of a FinFET structure at an intermediate stage of fabrication. Fin 120 includes alternating channel regions 130 and source/drain regions 140 as understood by one skilled in the art. Illustrated is a replacement metal gate (RMG) structure following formation of a sacrificial gate 210 over the channel regions 130 of the fin 120. A hard mask 220 overlies the sacrificial gate 210. A source/drain junction 300 is formed over each source/drain region 140 of the fin. The sacrificial gate 210 and hard mask 220 are used to template the formation of sidewall spacers 230, followed by a conformal liner 410 and a dielectric fill layer 420 directly over the conformal liner 410, i.e., within contact locations over the source/drain junctions 300.

The sacrificial gate 210 and overlying hard mask 220 may be formed using conventional deposition, photolithography and etching processes. The sacrificial gate 210 may include a layer of amorphous silicon (a-Si), for example. Amorphous elemental silicon can be deposited using chemical vapor deposition, such as low pressure chemical vapor deposition (LPCVD) at temperatures ranging from 450° C. to 700° C. Silane ($SiH_4$) can be used as the precursor for CVD silicon deposition. The hard mask 220 may include a dielectric material such as silicon nitride, and may be formed using chemical vapor deposition.

The sacrificial gate 210 may have a thickness sufficient to completely cover the fins 120. For instance, a thickness of sacrificial gate 210 may range from 50 to 200 nm, e.g., 50, 75, 100, 125, 150, 175 or 200 nm, including ranges between any of the foregoing values, although lesser and greater thicknesses may be used.

As will be described in further detail below, sacrificial gate 210 is adapted to provide a temporary structure for a replacement metal gate (RMG) module that is used to form a functional gate over each channel region of the fin. As used herein, a "functional gate" refers to a structure used to control output current (i.e., the flow of carriers through a channel) of a semiconductor device using an electrical field or, in some instances, a magnetic field, and includes a gate dielectric and a gate conductor. Metallization of the functional gates and the source/drain regions may be used to form operable devices.

In the illustrated embodiment of FIG. 2, sidewall spacers 230 are disposed over sidewalls (vertical surfaces) of the sacrificial gate 210, and conformal liner 410 and dielectric fill layer 420 are disposed over the sidewall spacers 230 as well as over a top surface of the source/drain junctions 300. The conformal liner 320 is adapted to function as a contact etch stop layer (CESL).

The sidewall spacers 230 may be formed by blanket deposition of a spacer material (e.g., using atomic layer deposition) followed by a directional etch such as reactive ion etching (RIE) to remove the spacer material from horizontal surfaces. In certain embodiments, the sidewall spacer thickness is 4 to 20 nm, e.g., 4, 10, 15 or 20 nm, including ranges between any of the foregoing values.

Source/drain junctions 300 may be formed by ion implantation or selective epitaxy following formation of the sacrificial gate 210 and sidewall spacers 230, but prior to depositing the conformal liner 410 and the dielectric fill layer 420, e.g., using the sidewall spacers 230 as an alignment mask.

According to various embodiments, source/drain junctions 300 may include silicon (e.g., Si) or a silicon-containing material such as silicon germanium (SiGe). For instance, SiGe source/drain junctions may be incorporated into a p-MOS device to provide compressive stress to the channel, which can improve carrier mobility.

The terms "epitaxy," "epitaxial" and/or "epitaxial growth and/or deposition" refer to the growth of a semiconductor material layer on a deposition surface of a semiconductor material, in which the semiconductor material layer being grown assumes the same crystalline habit as the semiconductor material of the deposition surface. For example, in an epitaxial deposition process, chemical reactants provided by source gases are controlled and the system parameters are set so that depositing atoms alight on the deposition surface and remain sufficiently mobile via surface diffusion to orient themselves according to the crystalline orientation of the atoms of the deposition surface. Therefore, an epitaxial semiconductor material has the same crystalline characteristics as the deposition surface on which it is formed. Example epitaxial growth processes include low energy plasma deposition, liquid phase epitaxy, molecular beam epitaxy, and atmospheric pressure chemical vapor deposition.

The source/drain junctions 300 may be doped, which may be performed in situ, i.e., during epitaxial growth, or following epitaxial growth, for example, using ion implantation or plasma doping. Doping changes the electron and hole carrier concentrations of an intrinsic semiconductor at thermal equilibrium. A doped layer or region may be p-type or n-type.

As used herein, "p-type" refers to the addition of impurities to an intrinsic semiconductor that creates a deficiency of valence electrons. In a silicon-containing fin, example p-type dopants, i.e., impurities, include but are not limited to boron, aluminum, gallium, and indium. As used herein, "n-type" refers to the addition of impurities that contribute free electrons to an intrinsic semiconductor. In a silicon-containing fin, example n-type dopants, i.e., impurities, include but are not limited to, antimony, arsenic, and phosphorus.

An optional drive-in anneal can be used to diffuse dopant species and generate a desired dopant profile. In certain embodiments, dopant atoms within the source/drain junctions 300 may be diffused into the semiconductor fin 120 using a post-epitaxy or post-implantation anneal (e.g., at a temperature of 600° C. to 1400° C.) to create a desired dopant profile within the fin.

The conformal liner 410 and dielectric fill layer 420 are successively formed over the source/drain junctions 300 and over sidewall spacers 230 to fill the trench over the source/drain junctions 300, and the resulting structure is planarized, optionally using hard mask 220 as an etch stop layer.

"Planarization" is a material removal process that employs at least mechanical forces, such as frictional media, to produce a substantially two-dimensional surface. A planarization process may include chemical mechanical polishing (CMP) or grinding. Chemical mechanical polishing (CMP) is a material removal process that uses both chemical reactions and mechanical forces to remove material and planarize a surface.

Conformal liner 410 may be formed by blanket deposition of a suitable contact etch stop material (e.g., using atomic layer deposition). In certain embodiments, the conformal liner 410 thickness is 2 to 10 nm, e.g., 2, 4, 6, 8 or 10 nm, including ranges between any of the foregoing values.

Suitable sidewall spacer and conformal liner materials include oxides, nitrides and oxynitrides, such as silicon dioxide, silicon nitride, silicon oxynitride, and low dielectric constant (low-k) materials such as amorphous carbon, SiOC, SiOCN and SiBCN. As used herein, a "low-k" material has a dielectric constant less than that of silicon dioxide.

As used herein, the compounds silicon dioxide and silicon nitride have compositions that are nominally represented as $SiO_2$ and $Si_3N_4$, respectively. The terms silicon dioxide and silicon refer to not only these stoichiometric compositions, but also to oxide and nitride compositions that deviate from the stoichiometric compositions.

In various embodiments, the sidewall spacer 230 and the conformal liner 410 are formed from materials that can be etched selectively to one another. In particular embodiments, the sidewall spacer 230 includes SiOCN and the conformal liner (i.e., contact etch stop layer) 410 includes silicon nitride.

The dielectric fill layer 420 may include any dielectric material including, for example, oxides, nitrides or oxynitrides. In one embodiment, the dielectric fill layer 420 includes silicon dioxide. In various embodiments, the dielectric fill layer 420 may be self-planarizing, or the top surface of the dielectric fill layer 420 can be planarized by chemical mechanical polishing (CMP).

Figure 3:
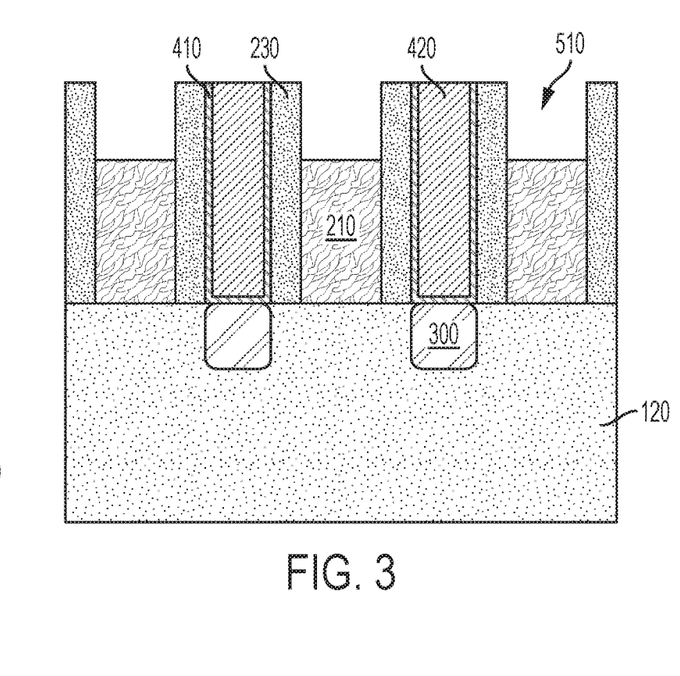
FIG. 3 shows the structure of FIG. 2 following a recess etch of the sacrificial gates to form upper gate contact openings.

Referring to FIG. 3, hard mask 220 is removed and the sacrificial gate 210 is recessed to a height below a top surface of the sidewall spacers 230. The sacrificial gate 210 may be recessed using a reactive ion etching (RIE) process. In particular embodiments, the sacrificial gate 210 is etched selectively with respect to the (low-k) sidewall spacer 230, contact etch stop layer 410, and dielectric fill layer 420. In certain embodiments, 10% to 75% of the original sacrificial gate height is removed by the recess etch.

As used herein, the terms "selective" or "selectively" in reference to a material removal or etch process denote that the rate of material removal for a first material is greater than the rate of removal for at least another material of the structure to which the material removal process is applied. For example, in certain embodiments, a selective etch may include an etch chemistry that removes a first material selectively to a second material by a ratio of 2:1 or greater, e.g., 5:1, 10:1 or 20:1.

Figure 4:
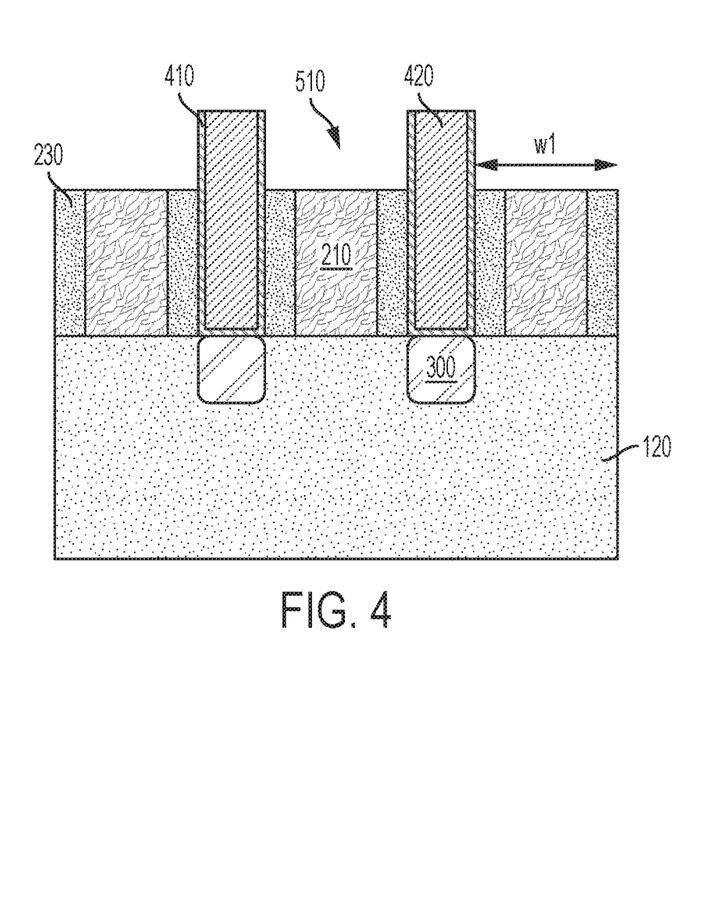
FIG. 4 shows a recess etch of the spacer layer and the concomitant widening of the upper gate contact openings.

Referring to FIG. 4, a further etching step is used to remove upper portions of the sidewall spacers 230 exposing the contact etch stop layers 410. In example embodiments, upper portions of the sidewall spacers 230 may be removed using a plasma etching process that is selective to silicon dioxide, such that the dielectric fill layer 420 is substantially un-etched. In the illustrated embodiment, a recess etch of the sidewall spacers 230 forms an upper gate contact opening 510 over channel regions 130 of the fin 120 extending between adjacent contact etch stop layers 410. Upper gate contact opening 510 has a width, w1. In the illustrated embodiment, following the selective etch of the sidewall spacers 230, top surfaces of remaining portions of the sidewall spacers 230 are co-planar with the recessed sacrificial gate 210.

Figure 5:
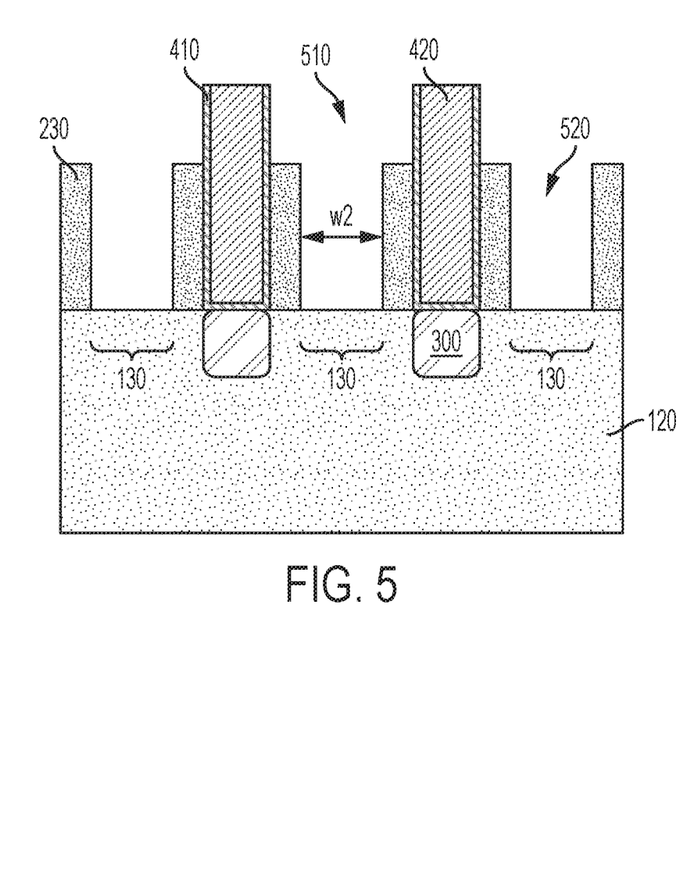
FIG. 5 shows the removal of the sacrificial gate to form lower gate contact openings and expose an upper surface of the fin.

Referring to FIG. 5, the sacrificial gate 210 is etched selectively with respect to sidewall spacers 230, contact etch stop layer 410, and dielectric fill layer 420 to form lower gate contact openings 520 and expose channel regions 130 of fin 120. A width (w2) of the lower gate contact openings 520 is less than the width (w1) of the upper gate contact openings 510. In certain embodiments, the width (w1) of the upper gate contact openings 510 may range from 25 to 50 nm, e.g., 25, 30, 35, 40, 45 or 50 nm, including ranges between any of the foregoing values, and the width (w2) of the lower gate contact openings 520 may range from 15 to 30 nm, e.g., 15, 20, 25 or 30 nm, including ranges between any of the foregoing values.

Figure 6:
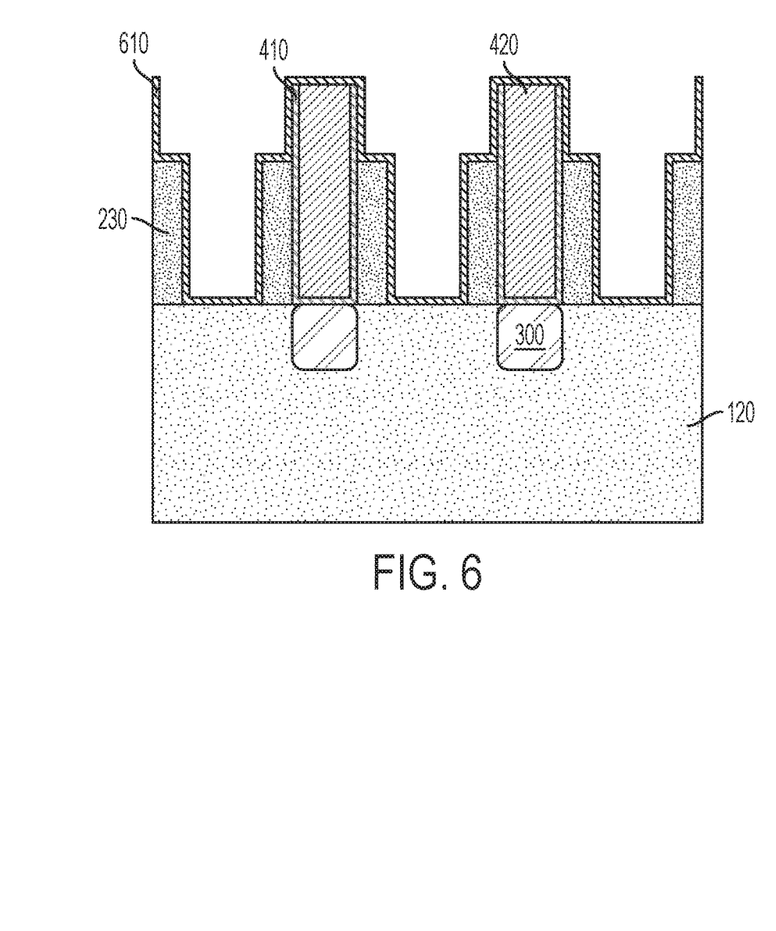
FIG. 6 depicts the deposition of a high-k layer within the upper and lower gate contact openings and over the fin.

Referring to FIG. 6, a conformal high-k layer 610 is formed over the top and sidewall surfaces of the fin 120, i.e., directly over the fin 120, as well as over sidewalls and top surfaces of the sidewall spacers 230, and over exposed portions of the contact etch stop layer 410. The high-k layer 610 may be formed by a conformal deposition process such as atomic layer deposition (ALD), for example.

In various embodiments, the high-k layer 610 is adapted to function as a gate dielectric layer. As used herein, a high-k material has a dielectric constant greater than that of silicon dioxide. A high-k dielectric may include a binary or ternary compound such as hafnium oxide ($HfO_2$). Further exemplary high-k dielectrics include, but are not limited to, $ZrO_2$, $La_2O_3$, $Al_2O_3$, $TiO_2$, $SrTiO_3$, $BaTiO_3$, $LaAlO_3$, $Y_2O_3$, $HfO_xN_y$, $HfSiO_xN_y$, $ZrO_xN_y$, $La_2O_xN_y$, $Al_2O_xN_y$, $TiO_xN_y$, $SrTiO_xN_y$, $LaAlO_xN_y$, $Y_2O_xN_y$, $SiO_xN_y$, $SiN_x$, a silicate thereof, and an alloy thereof. Each value of x may independently vary from 0.5 to 3, and each value of y may independently vary from 0 to 2. The thickness of the high-k layer 610 may range from 1 nm to 10 nm, e.g., 1, 2, 4, 6, 8 or 10 nm, including ranges between any of the foregoing.

Figure 7:
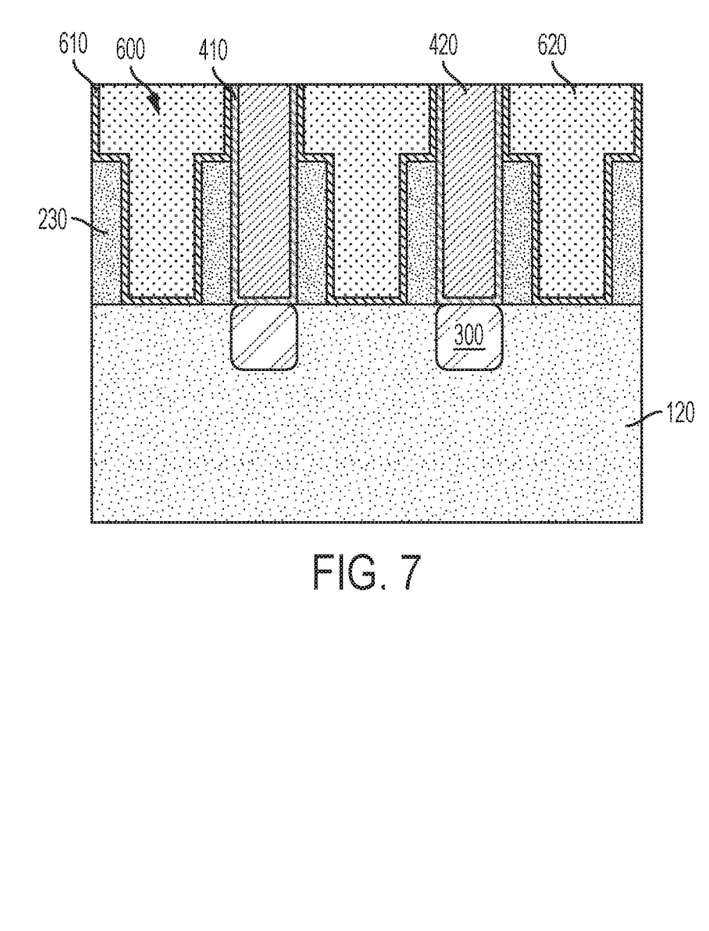
FIG. 7 shows the deposition and planarization of one or more gate conductor layers over the high-k layer within the gate contact openings.

Referring to FIG. 7, a gate conductor layer 620 is formed over the high-k layer 610 and substantially fills the upper and lower gate contact openings 510, 520. The gate conductor 620 and gate dielectric 610 define a gate stack 600. The gate conductor 620 may include a conductive material such as polysilicon, silicon-germanium, a conductive metal such as Al, W, Cu, Ti, Ta, W, Co, Pt, Ag, Au, Ru, Ir, Rh and Re, alloys of conductive metals, e.g., Al—Cu, silicides of a conductive metal, e.g., W silicide, and Pt silicide, or other conductive metal compounds such as TiN, TiC, TiSiN, TiTaN, TaN, TaAlN, TaSiN, TaRuN, WSiN, NiSi, CoSi, as well as combinations thereof. The gate conductor 620 may include one or more layers of such materials such as, for example, a metal stack including a work function metal layer and/or a conductive liner, and may have a thickness of 20 to 40 nm. In certain embodiments, the gate conductor 620 includes a titanium nitride (TiN) layer directly over the high-k layer 610 and a tungsten (W) or cobalt (Co) fill layer over the titanium nitride layer.

As shown in FIG. 7, a reactive ion etching (RIE) step or a CMP step can be used to remove the gate conductor layer 620 and the high-k layer 610 from over top of the dielectric fill layer 420 and form a planarized structure.

Figure 8:
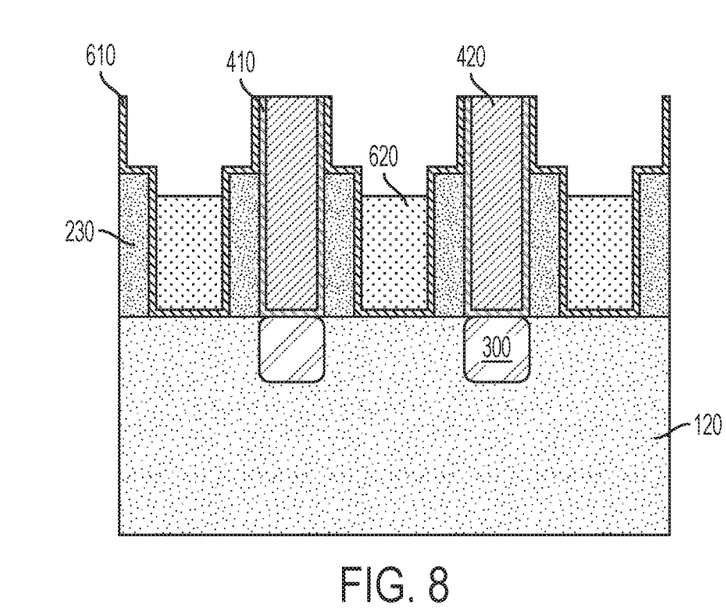
FIG. 8 shows a recess etch of the gate conductor layer(s)

Referring to FIG. 8, a height of the gate conductor layer 620 within the gate contact openings is decreased using a recess etch. Following the recess etch, a top surface of the gate conductor 620 is disposed below a top surface of the adjacent sidewall spacers 230. In various embodiments, the gate conductor layer 620 is removed selectively with respect to the gate dielectric layer 610.

Figure 9:
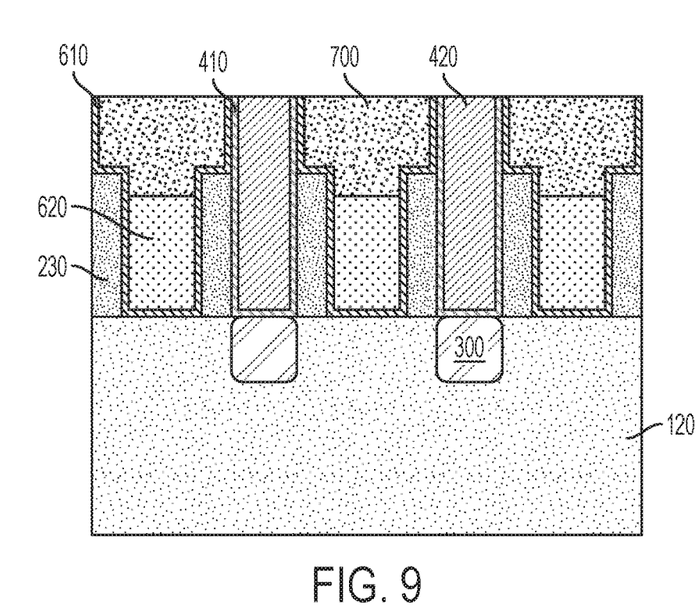
FIG. 9 depicts the formation and planarization of a capping layer over the recessed gate conductor layer(s) and over the high-k layer.

Referring to FIG. 9, a gate cap 700 is formed directly over the gate conductor 620 and over exposed surfaces of the high-k layer 610, i.e., within upper gate contact opening 510. By way of example, the gate cap 700 may include a nitride material such as silicon nitride or silicon oxynitride (SiON). Following deposition of the gate cap material, a polishing step may be used to form a planarized structure. The polishing step may expose the dielectric fill layer 420.

Figure 10:
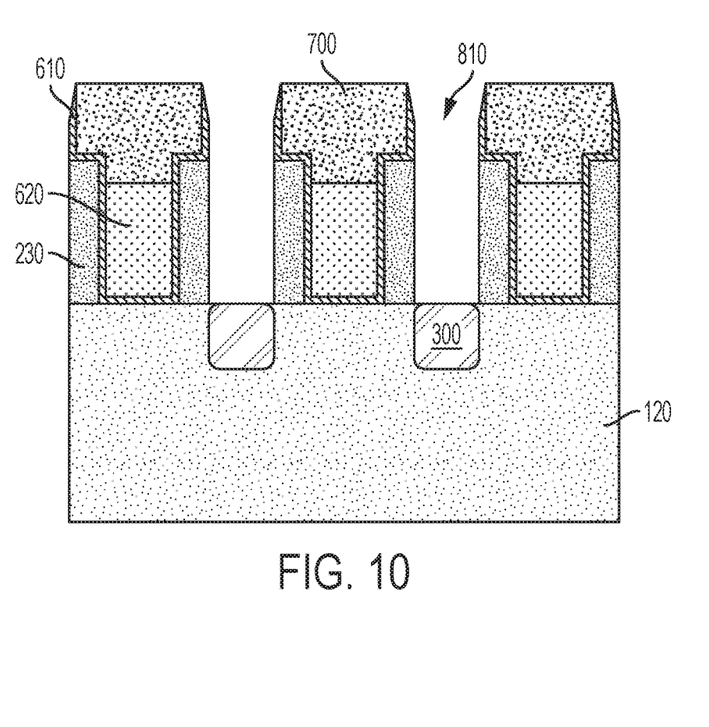
FIG. 10 shows removal of the dielectric fill layer and contact etch stop layer from over the source/drain junctions to form contact trenches.

Referring to FIG. 10, the dielectric fill layer 420 and the conformal liner 410 are removed to form self-aligned contact openings 810 for forming source/drain contacts. Removal of the dielectric fill layer 420 and the conformal liner 410 from over source/drain junctions 210 can be performed using one or more etch steps that are is selective to the adjacent, exposed layers. For instance, the conformal liner 410 can be removed by a reactive ion etch or isotropic etch such as a wet etch or an isotropic plasma etch. An example wet etch chemistry that can be used to remove the CESL layer 410 includes phosphoric acid.

Prior to metallization of the source/drain region, a wet etch can be used to remove native oxide from over the source/drain junctions 300. An example wet etch for stripping oxide includes hydrofluoric acid or a solution that includes dilute hydrofluoric acid (d-HF).

During the wet etch, some etching of the high-k layer may occur. However, in certain embodiments, the high-k layer 610, the sidewall spacer 230 and the capping layer 700 together form a continuous barrier between the contact openings 810 over source/drain junctions 300 and the gate 620.

In the illustrated embodiment, the high-k layer 610 is disposed over sidewall surfaces of the capping layer 700. Further, as a result of the prior recess etch of the gate 620, a bottom surface of the capping layer 700 is offset from a top surface of the spacer layer 230. Thus, a sidewall surface of the capping layer 700 overlaps a sidewall surface of the spacer layer 230 to form a continuous barrier that decreases the likelihood of a short circuit between the gate 620 and later-formed source/drain metallization within contact opening 810.

Figure 11:
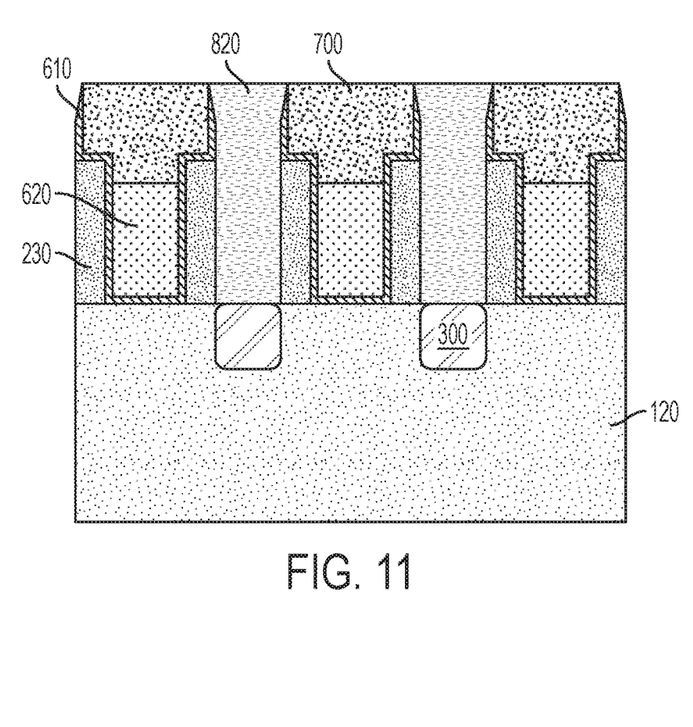
FIG. 11 depicts the formation of conductive contacts within the contact trenches over the source/drain junctions.

Referring to FIG. 11, a conductive contact 820 is formed within the contact openings 810 and over exposed surfaces of the source/drain junctions 300 by depositing, for example, a conductive liner and a barrier layer (not separately shown) and then filling the contact openings with a conductive material such as tungsten or cobalt. The conductive liner is typically titanium and the barrier layer may be titanium nitride (TiN).

Conductive contacts 820 may include a metal that forms an ohmic contact with the source/drain junctions 300. A silicide layer (e.g., titanium silicide) may be formed in situ via reaction between the conductive liner (e.g., titanium) and the source/drain junctions 300 to form a trench silicide contact.

After formation of the conductive contacts 820, a planarization process may be used to form a planarized structure as shown in FIG. 11, where a top surface of the conductive contacts 820 is co-planar with a top surface of the gate capping layers 700.

Figure 12:
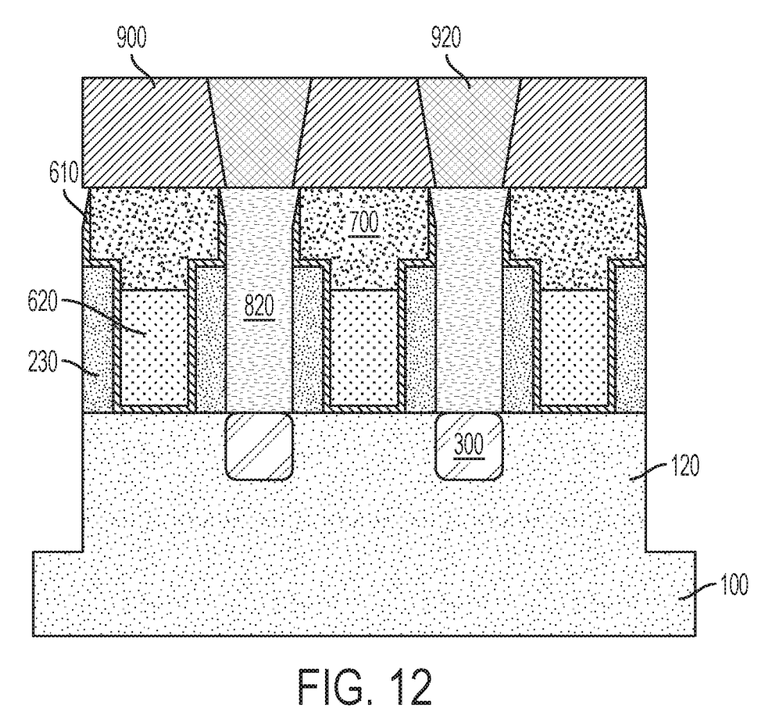
FIG. 12 is a cross-sectional schematic diagram of a FinFET structure including the high-k layer disposed between a source/drain contact and an adjacent self-aligned gate cap.

Referring to FIG. 12, an interlayer dielectric 900 may be formed over the structure of FIG. 11. Using conventional photolithography and etching techniques, openings may be formed in the interlayer dielectric 900 and source/drain contacts 920 formed within the openings, i.e., in electrical contact with conductive contacts 820.

In accordance with various embodiments, the disclosed implementation of a high-k layer and self-aligned capping layer provides a robust metallization architecture with a decreased likelihood of inter-contact electrical short circuits. Integrated circuits fabricated with the instant method exhibit improved reliability and performance, with minimal leakage between gate and source/drain contacts, and decreased instances of circuit failure.

As used herein, the singular forms "a," "an" and "the" include plural referents unless the context clearly dictates otherwise. Thus, for example, reference to a "fin" includes examples having two or more such "fins" unless the context clearly indicates otherwise.

Unless otherwise expressly stated, it is in no way intended that any method set forth herein be construed as requiring that its steps be performed in a specific order. Accordingly, where a method claim does not actually recite an order to be followed by its steps or it is not otherwise specifically stated in the claims or descriptions that the steps are to be limited to a specific order, it is no way intended that any particular order be inferred. Any recited single or multiple feature or aspect in any one claim can be combined or permuted with any other recited feature or aspect in any other claim or claims.

It will be understood that when an element such as a layer, region or substrate is referred to as being formed on, deposited on, or disposed "on" or "over" another element, it can be directly on the other element or intervening elements may also be present. In contrast, when an element is referred to as being "directly on" or "directly over" another element, no intervening elements are present.

While various features, elements or steps of particular embodiments may be disclosed using the transitional phrase "comprising," it is to be understood that alternative embodiments, including those that may be described using the transitional phrases "consisting" or "consisting essentially of," are implied. Thus, for example, implied alternative embodiments to a high-k layer that comprises hafnium oxide include embodiments where a high-k layer consists essentially of hafnium oxide and embodiments where a high-k layer consists of hafnium oxide.

It will be apparent to those skilled in the art that various modifications and variations can be made to the present invention without departing from the spirit and scope of the invention. Since modifications, combinations, sub-combinations and variations of the disclosed embodiments incorporating the spirit and substance of the invention may occur to persons skilled in the art, the invention should be construed to include everything within the scope of the appended claims and their equivalents.

What is claimed is:

1. A FinFET device, comprising:
    a semiconductor fin having a source/drain region and a channel region adjacent to the source/drain region;
    a conductive contact disposed over the source/drain region;
    a gate stack disposed over the channel region, wherein the gate stack comprises a high-k layer and a gate conductor layer overlying the high-k layer;
    a spacer layer between the conductive contact and the gate stack; and
    a capping layer disposed over the gate stack, wherein the high-k layer includes an upper portion disposed directly between the capping layer and the conductive contact, a lower portion extending along a sidewall of the spacer layer and disposed between the gate conductor layer and the spacer layer, and a middle portion extending along an upper surface of the spacer layer and disposed directly between the capping layer and the spacer layer.

2. The FinFET device of claim 1, wherein the capping layer has a lower portion having a first width disposed directly over the gate stack and an upper portion having a second width greater than the first width disposed over the lower portion.

3. The FinFET device of claim 2, wherein said portion of the high-k layer extends along a sidewall surface of the upper portion of the capping layer and is disposed directly between the upper portion of the capping layer and the conductive contact.

4. The FinFET device of claim 1, wherein a sidewall of the capping layer overlaps at least a portion of a sidewall of the spacer layer.

5. The FinFET device of claim 1, wherein a bottom surface of the capping layer is below a top surface of the spacer layer.

6. The FinFET device of claim 1, wherein the capping layer comprises silicon nitride and the spacer layer comprises a low-k dielectric.

7. The FinFET device of claim 1, wherein a top surface of the gate conductor layer is below a top surface of the spacer layer.

8. The FinFET device of claim 1, wherein a portion of the high-k layer is disposed directly over the channel region of the fin.

9. The FinFET device of claim 1, wherein a top surface of the conductive contact is co-planar with a top surface of the capping layer.

10. The FinFET device of claim 9, further comprising:
an interlayer dielectric disposed on the top surface of the capping layer.

11. The FinFET device of claim 9, further comprising:
a source/drain contact disposed on the top surface of the conductive contact.

12. A FinFET device, comprising:
a semiconductor fin having a source/drain region and a channel region adjacent to the source/drain region;
a conductive contact disposed over the source/drain region;
a gate stack disposed over the channel region;
a capping layer disposed over the gate stack;
a spacer layer between the conductive contact and the gate stack;
a low-k spacer layer between the conductive contact and the gate stack; and
a high-k layer disposed over an isolation layer, wherein the high-k layer includes an upper portion disposed directly between the capping layer and the conductive contact, a lower portion extending along a sidewall of the spacer layer and disposed between the gate conductor layer and the spacer layer, and a middle portion extending along an upper surface of the spacer layer and disposed directly between the capping layer and the spacer layer.

13. The FinFET device of claim 12, wherein the capping layer has a lower portion having a first width disposed directly over the gate stack and an upper portion having a second width greater than the first width disposed over the lower portion.

14. The FinFET device of claim 12, wherein a portion of the high-k layer is disposed directly over the channel region of the fin.

* * * * *